United States Patent [19]

Anthony et al.

[11] 4,168,992
[45] Sep. 25, 1979

[54] PROCESS FOR THERMAL GRADIENT ZONE MELTING UTILIZING A BEVELED WAFER AND A BEVELED GUARD RING

[75] Inventors: Thomas R. Anthony, Schenectady, N.Y.; Harvey E. Cline, Stanford, Calif.; Davis K. Hartman, Manlius; Mike F. Chang, Liverpool, both of N.Y.

[73] Assignee: General Electric Company, Schenectady, N.Y.

[21] Appl. No.: 967,283

[22] Filed: Dec. 7, 1978

[51] Int. Cl.² .......................................... H01L 21/225
[52] U.S. Cl. .................................... 148/1.5; 148/177; 148/187; 252/62.3 E
[58] Field of Search ................. 148/1.5, 33, 177, 187; 252/62.3 E, 62.3 GA

[56] References Cited

U.S. PATENT DOCUMENTS

| | | | |
|---|---|---|---|
| 2,813,048 | 11/1957 | Pfann | 75/65 ZM |
| 3,179,860 | 4/1965 | Clark et al. | 357/55 X |
| 3,895,967 | 7/1975 | Anthony et al. | 148/187 X |
| 4,001,047 | 1/1977 | Boah | 148/1.5 |
| 4,035,199 | 7/1977 | Anthony et al. | 148/1.5 |
| 4,075,038 | 2/1978 | Anthony et al. | 148/1.5 |

*Primary Examiner*—G. Ozaki
*Attorney, Agent, or Firm*—Donald M. Winegar; Joseph T. Cohen; Leo I. MaLossi

[57] ABSTRACT

A wafer of semiconductor material processed by thermal gradient zone melting is supported by a beveled inner peripheral surface defining an aperture in a guard ring to minimize the distortion of the thermal gradient at the outer peripheral edge surface of the wafer.

5 Claims, 4 Drawing Figures

PROCESS FOR THERMAL GRADIENT ZONE MELTING UTILIZING A BEVELED WAFER AND A BEVELED GUARD RING

BACKGROUND OF THE INVENTION

1. Field of the Invention

This invention relates to the manufacture of semiconductor devices and, more particularly, to a method of employing a wafer with a beveled edge and an annular guard ring with a beveled edge to improve the processing of wafers of semiconductor material by thermal gradient zone melting (TGZM).

2. Description of the Prior Art

In the manufacture of semiconductor devices, it is normally necessary to alter the conductivity type of one or more selected regions of a semiconductor body by doping these regions with conductivity-modifying impurity atoms. Today, such doping is usually accomplished commercially by solid state diffusion, ion implantation, liquid epitaxial growth or vapor epitaxial growth. Such factors, as costs, speed, junction characteristics, and the particular type of semiconductor material being used, determine which method is most practical.

A little used and less widely known technique for doping semiconductor material is thermal gradient zone melting. This technique can produce very abrupt junctions with unusual configurations and high dopant concentrations in a body of semiconductor material in a relatively short period of time. Early descriptions of such thermal migration and some of its applications are found in U.S. Pat. No. 2,813,048, issued to W. G. Pfann and in his book "Zone Melting", copyright by John Wiley and Sons, Inc. (1958). While the basic principle of thermal migration was known very early in the life of the semiconductor industry, a number of unsolved problems prevented its use as a standard processing technique by the semiconductor industry.

Thermal gradient zone melting (TGZM) is a process in which a small amount of dopant is disposed on a selected surface of a body of semiconductor material and the processed body is then exposed to a temperature gradient at an elevated temperature. The overall temperature at which the process is carried out must be sufficiently high in order to form a melt of metal-rich semiconductor material containing the dopant material. Under these conditions, the melt will migrate through solid body of material along and up the lines of heat flow (a thermal gradient) from low temperatures to high temperatures, leaving in its path a recrystallized region of semiconductor material containing the solid solubility limit of the metal therein which includes the dopant material. The temperature gradient must be uniform and unidirectional if the pattern of dopant material is disposed on the surface area which is on the entrance face of the wafer is to be faithfully reproduced as a recrystallized dopant zone or region in the semiconductor wafer.

One of the most difficult problems which appears to be preventing the widespread use of thermal gradient zone melting has been the inability for one to be able to generate a large uniform thermal gradient across the thickness of a thin fragile semiconductor wafer without fracturing the wafer or contaminating the wafer with undesirable impurities.

A number of means of applying a large uniform thermal gradient have been tried including a plasma torch, a gas torch, a solar mirror, a scanning electron beam, a heated anvil and infrared radiation. The most satisfactory method of those tried has been to expose one side of a semiconductor wafer to a widespread intense source of infrared radiation while at the same time exposing the opposing side of the wafer to a cold black body heat sink. For a complete description of the infrared radiation method, attention is directed to the teachings of John K. Boah, entitled "Temperature Gradient Zone Melting Utilizing Infrared Radiation", U.S. Pat. No. 4,001,047, and assigned to the same assignee as this application.

Although the infrared radiation method of Boah produces a uniform thermal gradient through most of a semiconductor wafer, it has been discovered that around the peripheral edges of a wafer the thermal gradients are severely distorted from their otherwise unidirectional direction, which is perpendicular to the two major opposed surfaces, in the rest of the wafer by the discontinuity associated with the peripheral edge of a wafer. On first examination, it would appear that this thermal gradient distortion should only extend inwardly the equivalent of several wafer thicknesses from the edge of a wafer.

With reference to FIG. 1, there is shown a wafer 110 of semiconductor material processed in the prior art by thermal gradient zone melting. The wafer 110 has opposed major surfaces 112 and 114. Migration of one or more melts of metal-rich semiconductor material is from surface 112 to surface 114 when the surface 114 is exposed to infrared radiation. The infrared radiation of Boah produces radiation 116 which is incident upon the surface 114 and travels through the wafer 110 and is reradiated from the surface 112 and edges 128 of the wafer 110 as flow lines 122. The loss of heat from the edge or edges 128 of the wafer 110 distorts the heat flow lines 120 from a course directly between and perpendicular to the major surfaces 112 and 114 to an angled course of travel. That is the heat flow lines 120 deviate from the normal to the surfaces 112 and 114, and are not parallel with each other. Such non-parallel heat flow 120 will distort, and in some instances, break up any liquid alloy melt zone migrating through the material regions of distorted heat flow in the wafer 110. Only the area, or volume of material, in the center of the wafer where the heat flow lines 120 are substantially parallel to each other and perpendicular to the major surfaces 112 and 114 of the wafer 110 is useful for commercial semiconductor processing. However, we have found experimentally that for a wafer 110 with a radius of 25.4 mm, and a thickness of 0.25 mm, that the distortion of the thermal gradient generated by a heat loss around the edge extends inwardly toward the center a distance of about 3 mm from the edge 128 of the wafer 110. Thus, the area over which the thermal distortion occurs represents about twenty percent of the area and volume of the wafer 110. Semiconductor devices made within this area or volume of material must be discarded in most cases, thereby reducing processing yields and increasing processing costs. Consequently, a strong commercial incentive exists to find a practical means of eliminating the thermal distortions in the area contiguous with the peripheral edge 128 of the semiconductor wafer 110.

In U.S. Pat. No. 4,035,199, we have previously disclosed a method by which such thermal distortion can be minimized around the edge of a semiconductor wafer by having an annular guard ring configuration of a layer of absorption enhancing material disposed on the outer peripheral portion of the semiconductor wafer facing the source of the infrared radiation, and by having a centrally oriented disc-like configuration of a layer of emission enhancing material on the opposing face of the wafer facing the heat sink. This configuration is engineered so that additional head is delivered to the otherwise relatively outer cold peripheral areas of the wafer while additional heat is drained from the otherwise relatively hot central portion of the wafer. The additional injection and extraction heat from these critical wafer areas minimized the heat flow tendencies shown in FIG. 1 and thus enabled one to use a larger percentage of the wafer area for device production. This result, however, was not obtained without incurring any disadvantages for a number of process steps had to be added to the overall process both to form and to configure the emission enhancing and absorption enhancing layers, thereby directly increasing production costs. In addition, for certain devices, the formation and configuration of these optical layers is not feasible since the various thermal anneals, chemical etches and masking steps involved either degrading or destroying the devices that one is attempting to produce.

In U.S. Pat. No. 3,895,967, we have previously disclosed a method by which thermal gradient distortions can be minimized around the edge of a thick semiconductor ingot as opposed to a thin semiconductor wafer. This method employed a guard ring of semiconductor material of the same thickness as the semiconductor ingot disposed about, and spaced from, the peripheral edge of the semiconductor ingot. This guard ring ingot arrangement adjusted the thermal distortion problem radially outward into the guard ring which could be re-used over and over again and eliminated thermal gradient distortions in the semiconductor ingot that was being processed. One requirement of this method was that the space or gap between the guard ring and the semiconductor ingot has to be less than one-tenth of the thickness of the semiconductor ingot. Otherwise, the guard ring becomes less effective and thermal distortion problems still are present in the peripheral edge portion of the semiconductor ingot.

For thin semiconductor wafers, the requirement that the separation width between the guard ring and the wafer be less than the wafer thickness and the requirement that the guard ring and the semiconductor wafer be co-planar make use of guard rings commercially unfeasible for a number of reasons. First, the wafer must be positioned in the guard ring without touching the guard ring. For small separations, this becomes exceedingly difficult and time consuming for mass production operations. Furthermore, the diameter of the wafers tend to vary from one lot to another requiring the costly manufacture of semiconductor guard rings for each new wafer lot. In addition, for thin wafers it is also difficult to align reproducibly the planes of the guard ring and the wafer. Without such parallel alignment, the guard ring method will not work effectively or may even be a complete failure.

In summary, then, the present methods of thermal gradient zone melting processing of thin semiconductor wafers either makes impossible the production of certain types of devices or wastes about twenty percent of a processed semiconductor wafer which must be discarded because of thermal gradient distortion problems around the peripheral edge portion of the wafer. In particular, the potentially attractive and simple prior art guard ring method in thick semiconductor ingots has been found to be commercially unfeasible for use in processing thin wafers of semiconductor material.

It is, therefore, an object of this invention to provide a new and improved method for processing bodies of semiconductor material by thermal gradient zone melting which overcomes deficiencies of the prior art.

Another object of this invention is to provide a new and improved method for minimizing thermal gradient edge distortions in thin semiconductor wafers during the practice of thermal gradient zone melting, which does not make impossible the production of certain types of devices.

Another object of this invention is to provide a new and improved method for minimizing thermal gradient edge distortions in thin semiconductor wafers during the practice of thermal gradient zone melting, which does not add a large number of additional wafer processing steps and therefore increase commercial production costs.

Other objects of this invention will, in part, be obvious and will, in part, appear hereinafter.

BRIEF DESCRIPTION OF THE INVENTION

In accordance with the teachings of this invention, there is provided an improved method for processing a body of semiconductor material by thermal gradient zone melting (TGZM). The improved process includes using a guard ring of semiconductor material of approximately twice the thickness as the semiconductor wafer and having a beveled inner diameter such that the maximum inner diameter of the internally beveled ring at the top surface of the guard ring is greater than the diameter of the semiconductor wafer and the minimum inner diameter of the internally beveled guard ring at the bottom surface of the guard ring is less than the diameter of the semiconductor wafer. A semiconductor wafer is disposed centrally in the beveled guard ring such that the bottom outer peripheral edge of the semiconductor wafer is placed in contact with the internal beveled surface of the guard ring. The minimum inner diameter of the beveled guard ring is such that it is less than a diameter corresponding to a diameter four times the standard distribution away from the mean wafer diameter on the low side so that the wafer reject rate because of a wafer falling through the guard ring is minimal. Similarly, the maximum inner diameter of the beveled guard ring is such that it is greater than a diameter corresponding to a diameter four times the standard distribution away from the mean diameter on the high side so that the wafer reject rate because of a wafer failing to fit into the guard ring is minimal.

In the above description of the invention, a semiconductor wafer with straight, right-angled sides was used in conjunction with an internally beveled guard ring to minimize thermal edge distortion in thermal gradient zone melting. A additional and alternative feature that can be utilized with the internally beveled guard ring is a semiconductor wafer whose outer peripheral edge has been beveled to an angle supplementary to the bevel angle of the guard ring.

DESCRIPTION OF THE INVENTION

Figure 1:
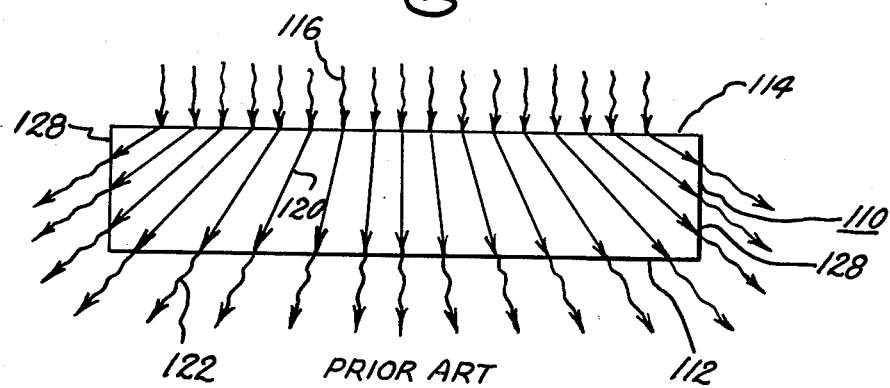
FIG. 1 is a side elevation view, in cross-section, of the heat flow lines in a body of semiconductor material processed by prior art methods.
Figure 2:
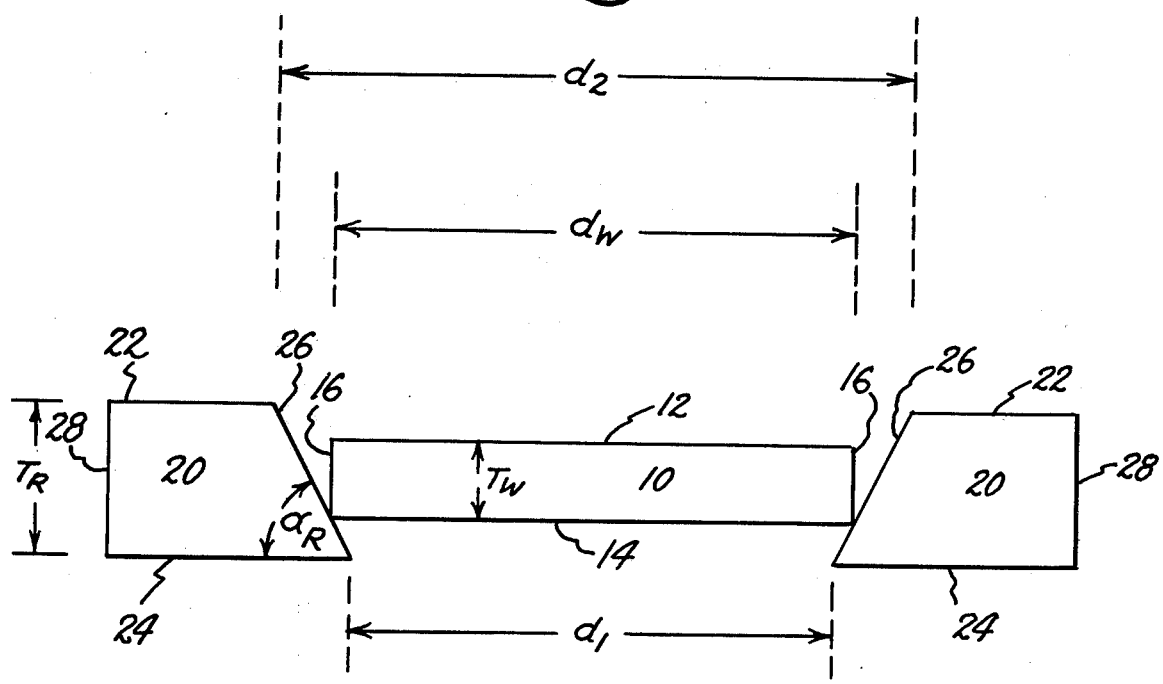
FIG. 2 is a side elevation view, in cross-section, of a semiconductor wafer with an outer peripheral edge at right angles to its major surfaces disposed centrally in an internally beveled guard ring.

Referring now to FIG. 2, there is shown a semiconductor wafer or body 10 having opposed major surfaces 12 and 14 which are, respectively, the top and bottom surfaces thereof and having outer side peripheral surfaces 16. The semiconductor material may be silicon, germanium, silicon carbide, gallium arsenide, a compound of a Group II element and a Group VI element, and a compound of a Group III element and a Group V element.

The semiconductor body 10 is disposed in a vertical axially aligned aperture of an internally beveled guard ring 20 having opposed major surfaces 22 and 24 which are, respectively, the top and bottom surfaces thereof and substantially parallel to each other and having opposed side surfaces 26 and 28 which are, respectively, the inner and outer peripheral surfaces thereof. The inner peripheral surface 26 of the vertical axially aligned aperture of the guard ring 20 is beveled such that the minimum inner diameter $d_1$ of the bevel is greater than the diameter $d_w$ of the semiconductor wafer 10 and the maximum inner diameter $d_2$ of the bevel is greater than the diameter $d_w$ of the semiconductor wafer 10. The thickness $T_R$ of the guard ring 20 is greater than the thickness $T_w$ of the body 10. Preferably, $T_R$ is about twice as great as $T_w$.

The guard ring 20 is made of a material which has the same, or substantially the same thermal conductivity as the material comprising the wafer 10. Silicon is an excellent choice since most wafers processed today are silicon and silicon is readily available. Silicon can be employed for guard rings 20 for processing wafers comprising other semiconductor materials such as germanium, silicon carbide, gallium arsenide, and the like. It is preferred whenever possible and economically feasible that the material for the guard ring 20 be of the same material as that of the wafer 20. The angle $\alpha_R$ of the internal bevel of the guard ring 20 is greater than 45 degrees and less than 80 degrees. At bevel angle $\alpha_R$ less than 45 degrees, thermal edge distortions begin to extend into large portions of the body 10. At angles $\alpha_R$ greater than 80 degrees, insertion and extraction of the wafer into and from, respectively, the beveled guard ring 20 becomes difficult and time-consuming for mass production operations and in addition with a constant thickness $T_R$ of ring 20 place a constraint on the diameter $d_w$ of the semiconductor wafer 10 that can be accommodated by the guard ring 20. Because in commercial production, the diameter of the semiconductor wafers vary statistically from one lot to the next, it is advantageous to have a guard ring 20 that will accommodate different lots of different statistically distributed sizes.

The annular guard ring 20 acts thermally like an extension of the semiconductor wafer 10 and consequently, distortions in the thermal gradient that would have occurred around the peripheral edge of body 10 in the absence of an annular guard ring 20 are translated to the guard ring 20, leaving the semiconductor wafer 10 substantially free from distortions in the thermal gradient.

The beveled surface 26 on the inner diameter of the annular guard ring 20 allows quick and accurate central positioning of the semiconductor wafer 10 by an operator in a mass production situation. In addition, for thin wafers, the beveled surface 26 allows the operator to quickly tilt the semiconductor wafer 10 within the annular guard ring 20 so that the planes of the guard ring 20 and the semiconductor wafer 10 may be quickly, accurately and reproducibly aligned in a mass production environment.

Figure 3:
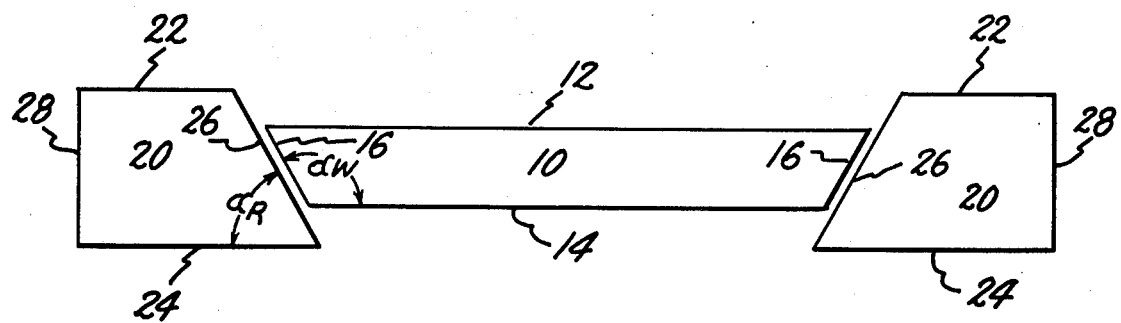
FIG. 3 is a side elevation view, in cross-section, of a semiconductor wafer with a beveled outer peripheral edge disposed centrally in an internally beveled guard ring.

Referring now to FIG. 3, an alternative configuration of our invention is shown. A semiconductor wafer or body 10 having opposed major surfaces 12 and 14 which are the top and bottom surfaces, thereof, and having a beveled outer peripheral surface 16 is shown disposed centrally in an annular guard ring 20. The annular guard ring 20 has opposed major planar surfaces 22 and 24, which are respectively the top and bottom surfaces thereof and has opposed side surfaces 26 and 28 which are, respectively, the inner and outer peripheral surfaces thereof. The inner peripheral surface 26 of the annular guard ring 20 is beveled such that the minimum inner diameter of the bevel is less than the minimum outer diameter of the beveled semiconductor wafer 10 and such that the maximum inner diameter of the bevel of body 20 is greater than the maximum outside diameter of the beveled semiconductor wafer 10. The bevel angles $\alpha_R$ of the annular guard ring 20 and $\alpha_w$ of the semiconductor wafer 10 are chosen such that they are the mathematical supplements of each other (i.e., $\alpha_R + \alpha_w = 180$ degrees).

Although an additional cost is incurred in beveling the semiconductor wafer 10, this economic disadvantage is offset by the increased good thermal fit between surfaces 16 and 26 and by the fact that the beveled nature of both the annular guard ring 20 and semiconductor wafer 10 causes substantial parallel alignment of the planes of the wafer and the guard ring by simply dropping the beveled wafer into the beveled guard ring. Without such substantial parallel alignment, the guard ring method does not work effectively.

Figure 4:
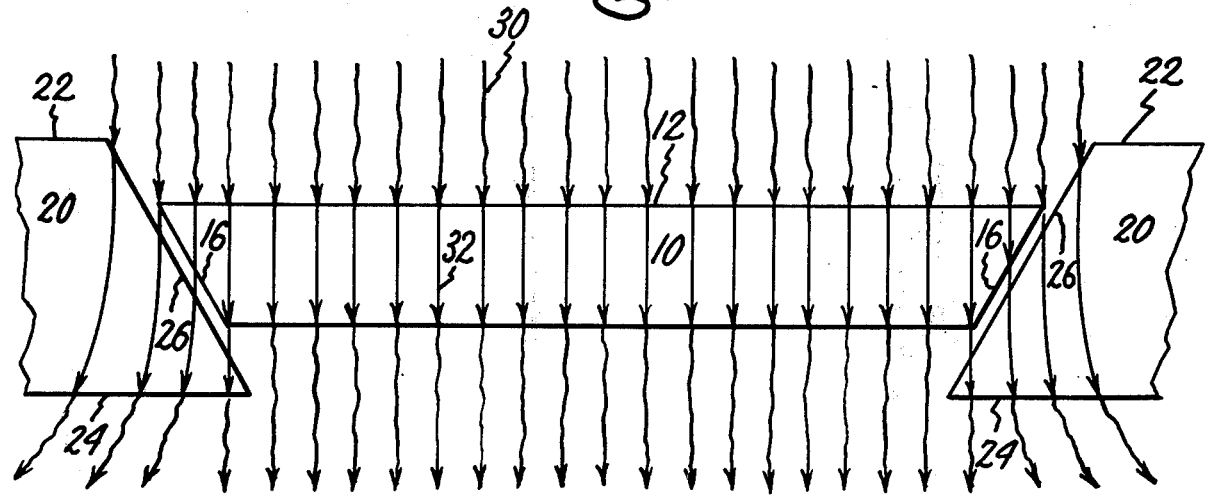
FIG. 4 is a side elevation view, in cross-section, of the heat flow lines in the body of semiconductor material of this invention.

Referring now to FIG. 4, the distribution of the flow of heat through body 10 during temperature gradient zone melting is shown. The radiation 30 from a radiant energy source is incident on the major top surfaces 12 and 22 of the semiconductor body 10 and annular guard ring 20, respectively. Because of the parallel intimate contact between surfaces 16 and 26, the heat flow lines 32 through body 10 are practically perpendicular to the major surfaces 12 and 14 of body 10 throughout body 10. Any major distortion in the heat flow lines has moved outward and into the annular guard ring 20.

The guard ring 20 of this invention increases the yield of wafers processed in another manner. Present apparatus embodies the employment of 3 supports, usually quartz material, to support the wafer during migration. These supports also induced thermal gradients which could result in bad devices being produced in the vicinity of the supports. The guard ring 20 is now supported on the 3 supports and the wafer 10 is in turn supported by the guard ring 20 thereby eliminating this portion of additional extraneous thermal gradient problem.

We claim as our invention:
1. In the method of moving a melt of metal-rich semiconductor material through a solid wafer of semicon- ductor material by thermal gradient zone melting processing comprising the step of a. selecting a wafer of single crystal semiconductor material so that the wafer has a first type conductivity, a selected resistivity, two major opposed surfaces which are, respectively, the top and bottom surfaces thereof, and at least the top surface having a preferred planar crystal structure orientation which is one selected from the group consisting of (100), (110) and (111), the vertical axis of the wafer being substantially aligned with a first axis of the crystal structure, the top surface accommodating on or more physical configurations of a layer of metal thereon;

b. vapor depositing a layer of metal on the selected surface of the wafer of semiconductor material;

c. heating the wafer and the metal deposit to a temperature sufficient to form a melt of metal-rich material on the surface of the wafer;

d. establishing a unidirectional temperature gradient substantially parallel to the vertical axis of the wafer and the first axis of the crystal structure;

e. migrating the metal-rich melt through the solid wafer along the unidirectional temperature gradient to divide the wafer into a plurality of regions of first type conductivity and to form at least one array of regions of recrystallized semiconductor material of the wafer having solid solubility of the vapor deposited metal therein, the metal including at least one dopant impurity material therein to impart a predetermined second type conductivity and a selected level of resistivity thereto;

the improvement in the method of processing which includes prior to heating the wafer for migration providing a guard ring for processing the wafer of semiconductor material, the guard ring comprising a body of semiconductor material having a thickness greater than the thickness of the wafer, two major opposed substantially parallel surfaces, which are respectively the top and bottom surfaces thereof, an outer peripheral edge surface and walls defining an axially aligned aperture extending entirely through the body and terminating in the two major surfaces and an inner peripheral edge surface, beveling the inner peripheral surface to provide a maximum diameter of the aperture in the top surface which is greater than the diameter of the wafer and a minimum diameter of the aperture in the bottom surface which is less than the diameter of the wafer, orienting the guard ring to expose the top surface to an energy source for processing the wafer by thermal gradient zone melting, disposing the prepared semiconductor wafer within the aperture of the guard ring, and so oriented that the top side of the wafer is facing toward the bottom surface of the guard ring, the outer peripheral edge of the top surface is in physical contact with the walls of the aperture and the major surfaces of both the wafer and the guard ring are substantially parallel to each other.

2. The method of claim 1 wherein beveling of the inner peripheral surface of the aperture produces an included acute angle with the bottom surface of the guard ring of from greater than 45° to less than 80°.

3. The method of claim 1 or 2 wherein the semiconductor material of the guard ring is silicon.

4. The method of claim 1 or 2 and further including beveling the outer peripheral edge of the wafer of semiconductor material to be processed while supported in the guard ring, the included obtuse angle between the outer peripheral edge of the wafer and the major surface of the wafer upon which the metal to be migrated is deposited being the supplement of the included angle of the beveled inner peripheral surface of the guard ring.

5. The method of claim 1 or 2, wherein the semiconductor material of the wafer is silicon.

* * * * *